United States Patent
Singh et al.

(10) Patent No.: US 9,355,691 B2
(45) Date of Patent: May 31, 2016

(54) MEMORY CONTROLLER

(71) Applicants: Prabhjot Singh, Noida (IN); Hemant Nautiyal, Noida (MY); Amit Rao, Ghaziabad (IN)

(72) Inventors: Prabhjot Singh, Noida (IN); Hemant Nautiyal, Noida (MY); Amit Rao, Ghaziabad (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 139 days.

(21) Appl. No.: 14/318,685

(22) Filed: Jun. 29, 2014

(65) Prior Publication Data

US 2015/0380067 A1 Dec. 31, 2015

(51) Int. Cl.
*G06F 13/00* (2006.01)
*G11C 7/10* (2006.01)
*G06F 13/16* (2006.01)

(52) U.S. Cl.
CPC .......... *G11C 7/1057* (2013.01); *G06F 13/1689* (2013.01); *G11C 7/1066* (2013.01)

(58) Field of Classification Search
CPC ....... G11C 7/1057; G11C 7/1084; G11C 7/22
See application file for complete search history.

(56) References Cited

U.S. PATENT DOCUMENTS

| | | | |
|---|---|---|---|
| 4,071,887 A | 1/1978 | Daly et al. |
| 6,003,118 A | 12/1999 | Chen |
| 6,509,762 B1 | 1/2003 | Moss et al. |
| 7,436,919 B2 | 10/2008 | Rahman et al. |
| 7,711,940 B2 | 5/2010 | Wada |
| 7,719,904 B2 | 5/2010 | Lee |
| 7,721,137 B2 | 5/2010 | Lin et al. |
| 7,778,095 B2 | 8/2010 | Na |
| 8,355,294 B2 | 1/2013 | Makwana et al. |

*Primary Examiner* — Yong Choe
(74) *Attorney, Agent, or Firm* — Charles E. Bergere

(57) ABSTRACT

A system provides synchronous read data sampling between a memory and a memory controller, which includes an asynchronous FIFO buffer and which outputs a clock and other control signals. An outbound control signal (e.g., read_enable) is used to time-stamp the beginning of a read access using a clock edge counter. The incoming read data is qualified based on the time-stamped value of the read_enable signal plus typical access latency by counting FIFO pops. The system performs correct data sampling irrespective of propagation delays between the controller and memory. The system may be implemented in a System on a Chip (SOC) device having a synchronous communication system.

9 Claims, 2 Drawing Sheets

US 9,355,691 B2

MEMORY CONTROLLER

BACKGROUND OF THE INVENTION

The present invention relates generally to reading data from a memory, and more particularly, to a method and apparatus for synchronous read data sampling.

In a typical synchronous memory system, a memory controller provides clock and other control signals (e.g., read enable) to a memory device. On receipt of a read qualifying control signal from the memory controller, the memory device outputs the read data after an access "latency" delay. As the operating speed of processors and microcontrollers has increased significantly in recent years, so have the operating speeds of peripheral devices such as synchronous memory devices. However, as frequency increases, propagation delay and PVT (process, voltage and temperature) variations play a more significant role in data transfer. Typically, in synchronous data processing systems, there is a phase difference, owing to propagation delays, between the clock and data signals transferred between components such as the aforementioned memory controller and memory device, which tends to increase with frequency. This can lead to incorrect data sampling during read operations.

One known solution to this problem uses a phase locked loop (PLL) circuit and a feedback loop where the clock edges seen by the memory device and memory controller are aligned. However, this solution fails in cases where the propagation delay is around one clock cycle or greater, and has the further disadvantage of requiring extra silicon area for the PLL. An alternative known solution uses feedback of clock and control signals to compensate for delays. However, this has the disadvantage of requiring extra pins for the feedback signals. Thus, it would be advantageous to provide a processing system for synchronous read sampling without the abovementioned drawbacks.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
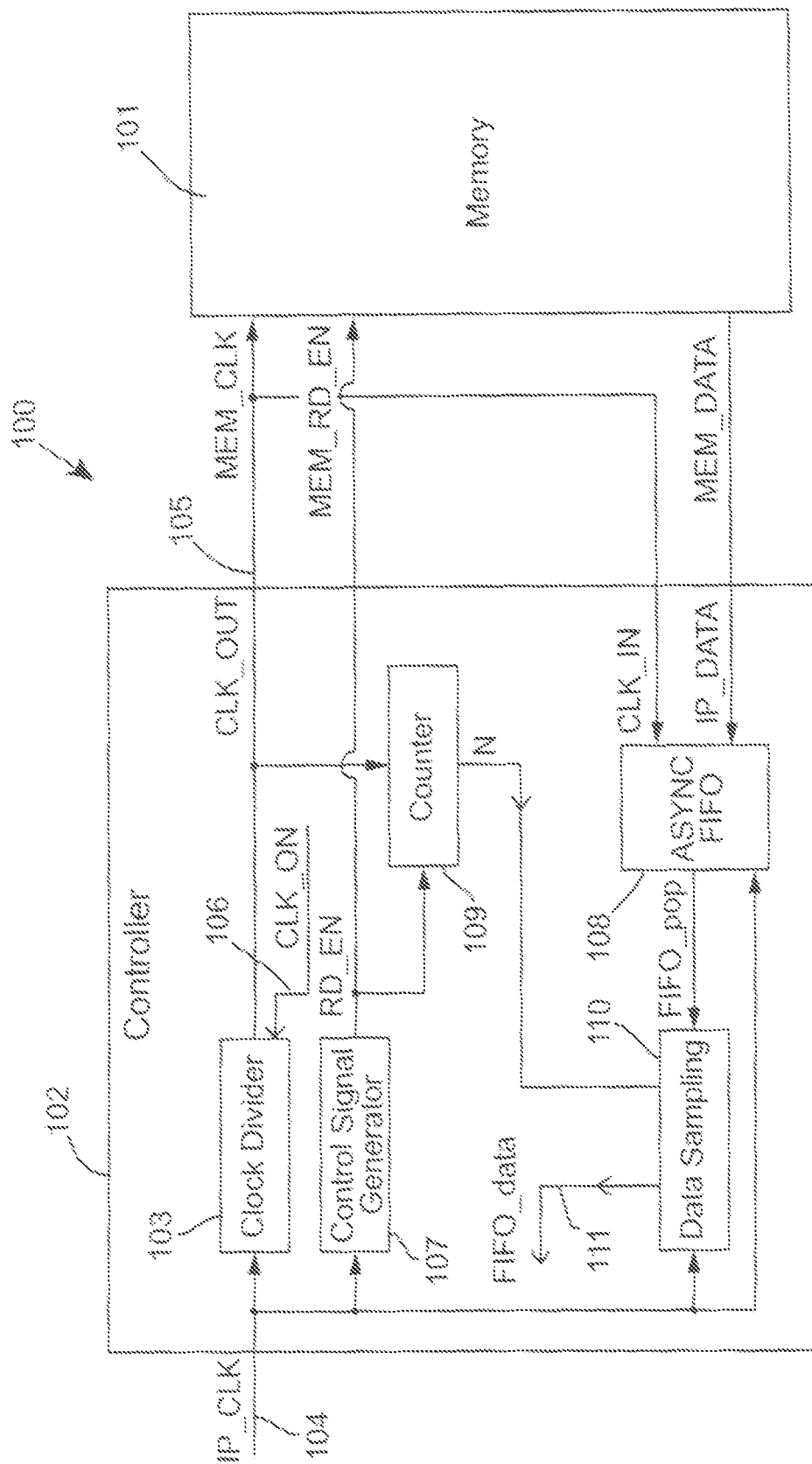
FIG. 1 is a simplified, schematic block diagram of a memory controller in accordance with an embodiment the invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a controller for use with a memory of a processing system where the memory has an access latency of 'L' system clock cycles. The controller comprises a FIFO (first in first out) buffer for receiving data read from the memory, a clock module for providing a system clock signal to the memory and to the FIFO buffer, a control signal generation module for asserting a control signal and applying the control signal to the memory, a counter module for determining an assertion time of the control signal as a function of a number, 'N' of system clock cycles, and a data sampling module for sampling the output of the FIFO buffer at a point in time that is a function of N and L.

In another embodiment, the present invention provides a method for reading data in a processing system comprising a memory and a controller, wherein the controller includes a FIFO (first in first out) buffer having an input for receiving data read from the memory, and an output, and wherein the memory has an access latency of 'L' system clock cycles. The method comprises applying a system clock signal to the memory and to the FIFO buffer, asserting a control signal and applying the control signal to the memory, determining a time of assertion of the control signal as a function of a number, N, of system clock cycles, and sampling the output of the FIFO buffer at a point in time that is a function of N and L.

In yet another embodiment, the present invention provides a processing system including a memory for storing data and having an access latency of 'L' system clock cycles, and a controller, coupled to the memory and including a FIFO (first in first out) buffer having an input, coupled to an output of the memory for receiving data read from the memory, and an output. The controller provides a system clock signal to the memory and to the FIFO buffer, asserts a control signal and applies the control signal to the memory, determines an assertion time of the control signal as a function of a number 'N' of system clock cycles, and samples the output of the FIFO buffer at a point in time that is a function of N and L.

The present invention can provide synchronous read data sampling between a memory device and a memory controller. An outbound control signal, such as a read enable signal can be used to time-stamp the beginning of a read access using a clock edge counter, for example. The incoming read data is qualified based on the time-stamped value of the read enable plus typical access latency by counting FIFO pops. The present invention enables correct data sampling irrespective of the magnitude of the propagation delays between controller and memory.

Advantageously, as only one feedback loop (from the system clock output back to the FIFO) is used, the present invention requires fewer pins than other known solutions. Also, no PLL is required, therefore saving on silicon or circuit board area. Further, the controller of the present invention can operate independent of frequency.

Referring now to FIG. 1, a schematic block diagram of a processing system 100 for synchronous read data sampling. The processing system 100 may be formed on an integrated circuits as part of a system on chip (SOC), for example. The processing system 100 includes a memory 101 for storing data, and a controller 102 that is coupled to the memory 101. In the illustrated embodiment, the controller 100 includes a clock divider 103 that receives an input clock signal (IP_CLK) on line 104 from an external source (not shown). The clock divider 103 generates a system clock signal (CLK_

OUT) of a particular frequency (which is less than the IP_CK) that is output from the controller 102 on line 105. The clock divider 103 is enabled by a CLK_ON signal (which may be generated by an external source (not shown)) on line 106. The system clock signal (CLK_OUT) is applied to the memory 101 and incurs a propagation delay prior to reaching the memory 101. The system clock signal including the propagation delay is shown as a memory clock signal (MEM_CLK). The propagation delay is unknown.

The controller 102 includes a control signal generator 107 for generating control signals for application to the memory 101. In this example, a control signal comprises a read enable signal (RD_EN), which is asserted and applied by the control signal generator 107 to the memory 101. The read enable signal typically suffers a delay before reaching the memory 101 as an input signal, and the delayed read enable signal is indicated as MEM_RD_EN. The magnitude of this delay is unknown.

The memory 101 typically reads stored data on an input clock edge when it receives a read enable signal (MEM_RD_EN) but there typically is a delay ("access latency") before the data is presented at the output of the memory. The access latency of a memory is usually provided in the manufacturer's data sheets and is typically expressed as a function of system clock cycles.

The controller 102 includes an asynchronous first-in-first-out (ASYNC FIFO) buffer 108 having a data input coupled to an output of the memory 101. The buffer 108 reads data (MEM_DATA) appearing at the output of the memory 101 and which arrives at the buffer 108 as a delayed version (IP_DATA). The delay incurred by the data in reaching the buffer 108 from the memory 101 is unknown. Data is clocked into and out of (as a FIFO 'pop') the buffer 108 by the delayed version of the memory clock signal (MEM_CLK). That is, the memory clock signal (MEM_CLK), which is looped back to the controller 102 and shown as CLK_IN when input to the buffer 108, is used to sample the data (MEM_DATA) input to the buffer 108.

The controller 101 includes a counter 109 that receives the system clock signal CLK_OUT from the clock divider 103 and receives the read enable signal RD_EN from the control signal generator 107. The counter 109 counts edges (for example, positive edges) of the system clock signal, CLK_OUT, and determines the number of edges counted from the start of the system clock and provides a time-stamp value, N, at its output when the read enable signal, RD_EN, is asserted.

The controller 102 also includes a data sampling module 110 that is coupled to the counter 109 and receives the time stamp value, N. The data sampling module 110 has stored therein the access latency value of the memory 101 as a number, L, of system clock cycles. The data sampling module 110 is also connected to the buffer 108 and receives therefrom and counts FIFO pops. The FIFO pops may be counted by, for example, a pulse counter. The data sampling module 110 samples the output of the buffer 108 at a particular point in time after the start of the system clock signal (CLK_OUT), such point in time being a function of the time-stamp value, N, received from the counter 109 and the access latency value, L. The data sampled at this point in time is output by the data sampling module 110 on line 111 for further processing.

In addition to the clock divider 103, the control signal generator 107, the data sampling module 110 and the buffer 108 all receive the input clock signal (IP_CK) in order to provide a fine control on the timing of control signals and to provide a clock signal necessary for operation at times when the clock divider 103 may have been disabled by removal of the CLK_ON signal.

Figure 2:
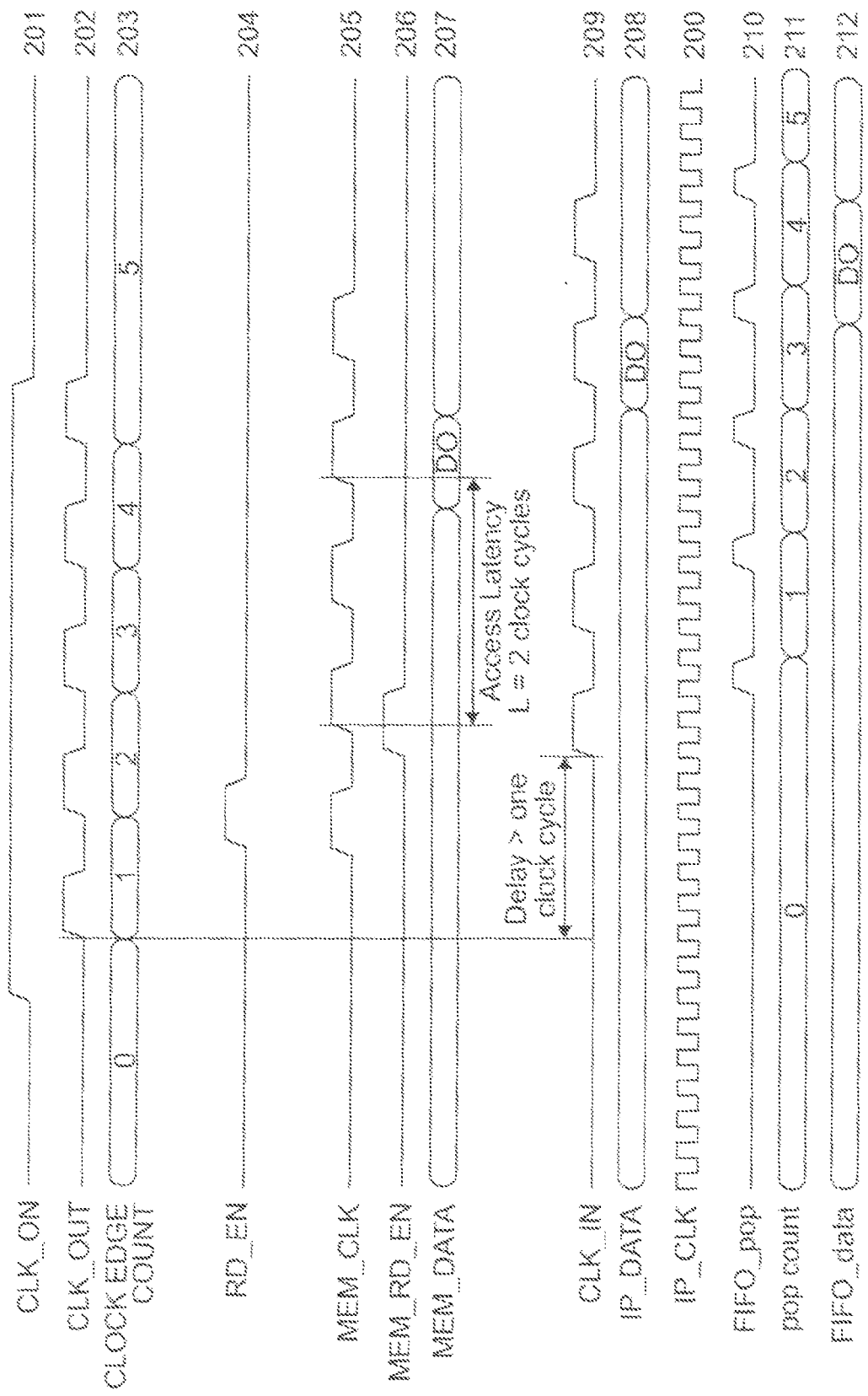
FIG. 2 is a timing diagram for data read cycles for the controller of FIG. 1.

FIG. 2 illustrates exemplary timing diagrams for data read from the processing system 100 of FIG. 1. In the illustrated embodiment, trace 200 represents the input clock signal, IP_CLK. While CLK_ON (trace 201) is high, the system clock signal CLK_OUT, trace 202, which is a divided version of IP_CK, is generated. Trace 203 represents a system clock positive edge count.

Trace 204 represents a control signal, such as the read enable (RD_EN) signal that is asserted (by going high) after one positive edge of the CLK_OUT signal has been counted. Hence, the time-stamp value, N, in this example, is equal to one.

Trace 205 represents the memory clock signal MEM_CLK, which is a delayed version of the system clock signal CLK_OUT. In this example, the delay between MEM_CLK and CLK_OUT is a little over half a cycle of the system clock signal.

Trace 206 represents the memory read enable signal MEM_RD_EN, which is a delayed version of RD_EN.

The read enable signal (MEM_RD_EN) received by the memory causes the memory 101, when clocked, to retrieve data, DO, (see trace 207) and present it at its output as MEM_DATA. However, this operation takes a period of time, known as the access latency, L. In this example, the access latency, L, has two, that is, it is equal to two system clock cycles. After a further delay, the read data DO arrives at the input of the buffer 108 as represented by IP_DATA, trace 208.

Trace 209 represents CLK_IN, the delayed system clock signal that is looped back to the buffer 108, as it arrives at the buffer 108. In this example, the delay incurred by the system clock signal from leaving the clock divider 103 to arriving at the buffer 108 is around one clock cycle. When the buffer 108 is not empty, data is read therefrom and output as a FIFO 'pop' on a positive edge of the input clock signal IP_CLK (see trace 210). However, the output of DO as a FIFO pop is delayed by a number of CLK_IN cycles equal to the time-stamp value N plus the access latency L.

Trace 211 represents a count of FIFO pops (as carried out by the data sampling module 110) from the start of the system clock. Therefore, when the pop count reaches three, the subsequent pop emerging (that is the fourth pop on trace 210) from the buffer 108 is captured (see trace 212, FIFO_data). This is valid read data because all delays in the system have been compensated for.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Further, the entire functionality of the circuits shown in FIG. 1 may be implemented in an integrated circuit. Such an integrated circuit may be a package containing one or more dies. Alternatively, the examples may be implemented as any number of separate integrated circuits or separate devices interconnected with each other in a suitable manner. For example, an integrated circuit device may comprise one or more dies in a single package with electronic components provided on the dies that form the circuits and which are connectable to other components outside the package through suitable connections such as pins of the package and bond wires between the pins and the dies.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A memory controller for reading data from a memory, wherein the memory has an access latency of 'L' memory clock cycles, where L is a positive integer, the controller comprising:
a FIFO (first in first out) buffer for receiving data read from the memory;
a clock module for providing a memory clock signal to the memory and to the FIFO buffer;
a control signal generation module for asserting a control signal and applying said control signal to the memory;
a counter for determining an assertion time of said control signal as a function of a number 'N' of cycles of the memory clock signal, where N is a positive integer; and
a data sampling module coupled to the counter and to the FIFO buffer for sampling an output of the FIFO buffer at a point in time that is a function of N and L.

2. The memory controller of claim 1, wherein data read from the memory is clocked into the FIFO by the memory clock signal and clocked out of the FIFO as a sequence of pops.

3. The controller of claim 2, wherein 'N' is the number of system clock edges, counted by the counter, that have elapsed from a start of the memory clock signal until assertion of said control signal.

4. The controller of claim 3, wherein the data sampling module has stored therein the access latency 'L' and receives the number 'N' from the counter and counts a number of FIFO pops output from the FIFO buffer and samples the subsequent FIFO pop after L+N pops have been counted.

5. The controller of claim 1, wherein the FIFO is an asynchronous FIFO.

6. The controller of claim 1, wherein the control signal comprises a read enable signal.

7. A method for reading data from a memory using a controller, wherein the controller includes a FIFO (first in first out) buffer having an input for receiving data read from the memory, and an output, and the memory has an access latency of 'L' memory clock cycles associated therewith, where L is a positive integer, the method comprising:
applying a memory clock signal to the memory and the FIFO buffer;
asserting a control signal and applying said control signal to the memory;
recording a time of assertion of the control signal as a function of a number, N, of cycles of the memory clock signal, where N is a positive integer; and
sampling the output of the FIFO buffer at a point in time that is a function of N and L.

8. A processing system, comprising:
a memory for storing data and having an access latency of 'L' memory clock cycles associated therewith, where L is a positive integer; and
a controller, operably coupled to the memory and including a FIFO (first in first out) buffer having an input coupled to an output of the memory for receiving data read from the memory,
wherein the controller provides a memory clock signal to the memory and to the FIFO buffer, asserts a control signal and applies said control signal to the memory, records a time of assertion of the control signal as a function of a number, N, of cycles of the memory clock signal, where N is a positive integer, and samples the output of the FIFO buffer at a point in time that is a function of N and L.

9. The system of claim 8, wherein the system is implemented in a system on a chip (SOC).

* * * * *